United States Patent [19]
Pourkeramati

[11] Patent Number: 6,058,045
[45] Date of Patent: May 2, 2000

[54] SERIAL FLASH MEMORY

[75] Inventor: Ali Pourkeramati, Redwood City, Calif.

[73] Assignee: Azalea Microelectronics, Santa Clara, Calif.

[21] Appl. No.: 09/318,200

[22] Filed: May 25, 1999

Related U.S. Application Data

[62] Division of application No. 08/926,576, Sep. 4, 1997, Pat. No. 5,953,254.
[60] Provisional application No. 60/025,698, Sep. 9, 1996.
[51] Int. Cl.$^7$ .................................................. G11C 16/04
[52] U.S. Cl. ............................... 365/185.17; 365/185.18; 365/185.29; 365/185.33
[58] Field of Search ..................... 365/185.17, 185.18, 365/185.29, 185.33

[56] References Cited

U.S. PATENT DOCUMENTS

| | | | |
|---|---|---|---|
| 4,894,402 | 1/1990 | Hsia et al. | 257/321 |
| 4,924,119 | 5/1990 | Lee | 257/321 |
| 5,008,721 | 4/1991 | Gill et al. | 365/185.33 |
| 5,216,270 | 6/1993 | Kaya et al. | 257/321 |
| 5,460,991 | 10/1995 | Hong | 438/261 |
| 5,666,307 | 9/1997 | Chang | 365/185.33 |
| 5,734,609 | 3/1998 | Choi et al. | 365/185.17 |
| 5,838,616 | 11/1998 | Randazzo | 365/185.26 |
| 5,898,616 | 4/1999 | Ono | 365/185.17 |
| 5,909,392 | 6/1999 | Chang et al. | 365/185.17 |
| 5,978,267 | 11/1999 | Chen et al. | 365/185.17 |

OTHER PUBLICATIONS

"Semiconductor Memories," Betty Price, Texas Instruments USA, 2$^{nd}$ Ed., 1983, 1991, John Wiley & Sons, Chichester, New York, Brisbane, Toronto, Singapore, pp. 586–604.

"A 3.3 V 32 Mb NAND Flash Memory with Incremental Step Pulse Programming Scheme," Suh et al., *IEEE Journal of Solid–State Circuits*, vol. 30, No. 11, Nov. 1995, pp. 1149–1156.

"A 35 ns Cycle Time 3.3 V Only 32 Mb NAND Flash EEPROM," Iwata et al., *IEEE Journal of Solid–State Circuits*, vol. 30, No. 11, Nov. 1995, pp. 1157–1162.

"Advanced Salicided EECMOS Technology for Complex PLDS," Advanced Micro Devices, USA, The 14$^{th}$ Annual IEEE Nonvolatile Semiconductor Memory Workshop, Monterey, CA Aug. 13–16, 1995.

"Process Technology and Device Built in Reliability in NOR Virtual Ground (NYG™) Flash Memories," National Semiconductor, U.S.A., The 14$^{th}$ Annual IEEE Nonvolatile Semiconductor Memory Workshop, Monterey, CA Aug. 13–16, 1995.

"High Density 'AND' Cell Technology for 32Mbit Flash Memory," Hitachi, Japan/Mitsubishi, Japan, The 14$^{th}$ Annual IEEE Nonvolatile Semiconductor Memory Workshop, Monterey, CA Aug. 13–16, 1995.

"Effective In–Process Plasma Damage Screening of Tunnel Oxide for Nonvolatile Memory Applications," Motorola, U.S.A., The 14$^{th}$ Annual IEEE Nonvolatile Semiconductor Memory Workshop, Monterey, CA Aug. 13–16, 1995.

"Sidewall Sealing Effects on Flash EEPROM," SGS–Thomson, Italy, The 14$^{th}$ Annual IEEE Nonvolatile Semiconductor Memory Workshop, Monterey, CA Aug. 13–16, 1995.

*Primary Examiner*—Trong Phan

[57] ABSTRACT

A scalable flash memory cell structure and method of manufacture is disclosed that improves data retention, increases capacitive coupling and speed of operation, and improves reliability among other advantages. The flash cell according to the present invention limits the tunnel oxide to a window having dimensions at the minimum feature size located over the drain side of the transistor. The tunnel oxide window is separated from the field oxide and has no edges abutting field oxide.

6 Claims, 4 Drawing Sheets

SERIAL FLASH MEMORY

This appln is a Divisional of Ser. No. 08/926,576 filed Sep. 4, 1997, U.S. Pat. No. 5,953,254 and also claims the benefit of U.S. Provisional No. 60/025,698 filed Sep. 9, 1996.

BACKGROUND OF THE INVENTION

The present invention relates in general to semiconductor memories, and in particular to an improved flash memory circuit and method of manufacture.

FIG. 1 shows a schematic cross-section of an example of a single-transistor double poly stacked gate flash cell. The cell includes a floating gate 100 made of a first polysilicon layer (poly-1), a control gate 102 made of a second polysilicon layer (poly-2), an N+ drain region 106 and an N++ source region 104 inside a P-well region 108. A thin layer of silicon dioxide of approximately 70 to 120 Angstroms forms the tunnel oxide 110 between the floating gate poly-1 and the channel, and a 150 to 300 Angstroms thick film made of an oxide-nitride-oxide (ONO) sandwich 112 separates the two poly gates 100 and 102.

This cell is programmed by grounding the source terminal, applying a 5 to 10 volt signal to the drain terminal or the bit line ($V_{BL}$=5v), and applying a high programming voltage $V_{PP}$ of, for example, 18 to 20 volts to control gate 102 ($V_{CG}$=$V_{PP}$). The high voltage on $V_{CG}$ creates a high electric filed across tunnel oxide 110 generating hot electrons in the channel with enough energy to cross the tunnel oxide. These hot electrons are then trapped in the floating gate poly-1 layer 100 resulting in a higher threshold voltage for the transistor. The cell is thus programmed into an OFF (non-conducting) state.

Erasing of the cell is performed by grounding the control gate and the drain terminal and applying $V_{PP}$ to the source terminal. The large gate to source voltage causes the trapped electrons on the floating poly 100 to tunnel through the thin oxide layer 110 by a mechanism known as Fowler-Nordhiem. The electrons are collected by the source region 104.

The flash memory cell shown in FIG. 1, however, suffers from a number of drawbacks in terms of its overall performance. Because the source region 104 is subject to very high erase voltages ($V_{PP}$), this cell requires a carefully engineered high-voltage junction process. As shown in FIG. 1, the source region 104 is made deeper than the drain region 106 and has a higher doping concentration. The high-voltage junction requirement results in a more complex and therefore more expensive process. Further, the high-voltage junction requirement results in a cell that is not scaleable. That is, the high-voltage diffusion to high-voltage diffusion spacing requirements increases the cell layout pitch. Lower endurance is another drawback of the high-voltage junction. since under high voltage conditions, the source region 104 cannot withstand a large number of erasures.

Furthermore, applying the high $V_{PP}$ voltage to the source region 104 generates hot holes that are released into the P-well 108 and then collected and trapped inside the tunnel oxide 110. This phenomenon, sometimes referred to as band bending, not only deteriorates the endurance of the cell, it also results in unpredictable erase threshold voltage over time. Additional erase threshold voltage verification circuitry are thus necessary for proper operation of the cell.

Finally, because the tunnel oxide region 110 is the same size as the channel, its capacitance is relatively larger, and thus the cell coupling capacitance is lower. Lower cell coupling capacitance requires larger program and erase voltages. Larger program and erase voltages not only lower the endurance of the cell, they also add to the circuitry as they require large pump circuits.

An improvement to the flash cell shown in FIG. 1 splits the erase voltage between the control gate 102 and the source 104. Instead of applying a high voltage to the source region 104, the control gate 102 is negatively biased with respect to the source terminal. Thus, in this embodiment, programming voltages remain the same, but during erase, a negative voltage is applied to the control gate ($V_{CG}$=$-V_{PP}$) while the source terminal connects to the positive power supply voltage (typically 3 to 5 volts). This allows the source junction to be the same size as the drain junction, and eliminates the high-voltage junction process requirements. However, this cell requires an additional negative pump circuit and still suffers from the hot hole injection and the resulting erratic erase threshold voltage.

Various other implementations of a single-transistor flash cell have been proposed each improving on some aspects of the cell performance, but with trade-offs in other aspects. For example, one approach that eliminates performance degradations caused by the hot hole injection, places the P-well 108 inside another N-well. This allows the P-well 108 to be biased to a positive voltage along with the source and drain regions, while the control gate is biased negatively for an erase operation. This type of flash cell, however, requires a triple well technology that is much more complex and costly to manufacture. Further, the cell still requires a negative pump circuit to bias the control gate during erase.

While there have been numerous variations on the double poly stacked gate single-transistor flash cell, there is room for improvement of the structure and design of the cell in terms of endurance, speed, reliability and cost of manufacture.

SUMMARY OF THE INVENTION

The present invention provides a novel scaleable flash memory cell structure and method of manufacture that improves data retention, increases capacitive coupling and speed of operation, and improves reliability among other advantages. The flash cell of the present invention permits implementation of arrays of flash memory cells that allow the designer to program and/or erase individual bytes of memory as well as blocks of memory. Therefore, the non-volatile memory circuit of the present invention combines the advantages of conventional EEPROM technology with that flash technology.

Broadly, the flash cell according to the present invention limits the tunnel oxide to a window having dimensions at the minimum feature size located over the drain side of the transistor. The tunnel oxide window is separated from the field oxide and has no edges abutting field oxide. Thus, leakage due to defects caused by the field edge is eliminated, resulting in higher data retention rates for the cell. The reduced dimensions of the tunnel oxide region significantly increase the gate capacitive coupling ratio of the cell. The higher gate coupling allows the cell to be smaller yet operate at higher speed (larger read current). The higher coupling ratio also reduces the level of the maximum required voltage resulting in higher endurance.

Accordingly, in one embodiment, the present invention provides a memory cell including a source region and a drain region forming a channel therebetween; a channel oxide layer disposed on top of the channel; a floating gate layer disposed on top of the channel oxide layer, where the floating gate layer and channel oxide layer define a window wherein a thickness of the channel oxide is substantially smaller than the remaining portion of the channel oxide. The memory cell further includes a control gate layer disposed on top of and separated from the floating gate layer by a dielectric film, wherein the window is located on a drain side of the channel and has dimensions at minimum feature size.

In another embodiment, the present invention provides a method of manufacturing a memory cell including the steps of A better understanding of the nature and advantages of the flash memory of the present invention may be had with reference to the drawings and detailed description below.

BRIEF DESCRIPTION OF THE DRAWINGS

FIG. 2A shows a top view of a specific embodiment of a single flash cell as initially laid out, while

DESCRIPTION OF THE PREFERRED EMBODIMENT

Various aspects of the flash memory according to the present invention will be described in detail hereinafter.

Cell Structural Design

Figure 1:
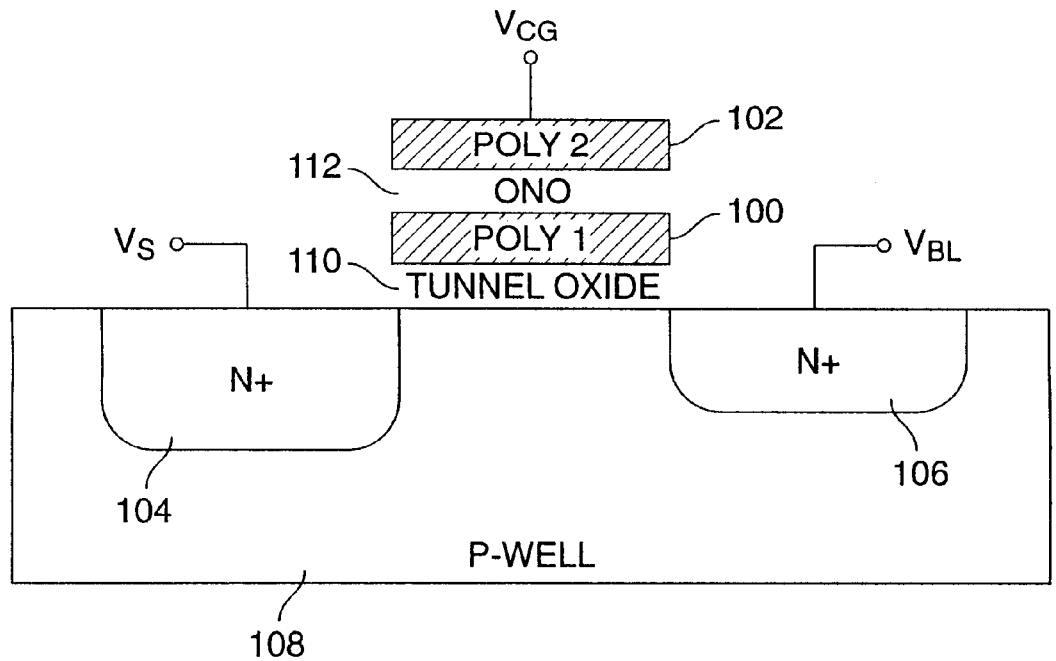
FIG. 1 shows an exemplary prior art double poly stacked gate single transistor flash memory cell.
Figure 2A:
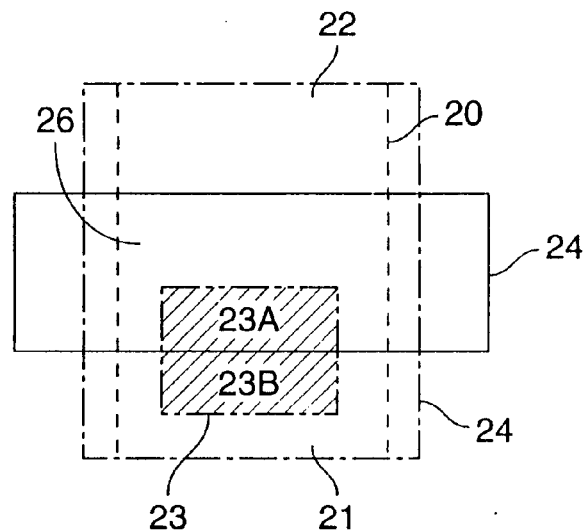
Figure 2B:
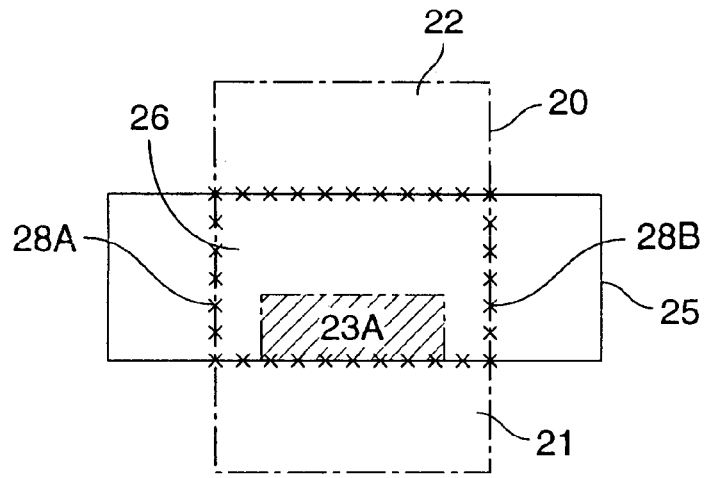
FIGS. 2B and 2C show top views of two different embodiments of the cell after it has been formed.

Referring to FIGS. 2A and 2B, there are shown top views of a specific embodiment of a single flash cell of the present invention as initially laid out, and a of the cell after it has been formed, respectively. In a preferred embodiment, each flash cell is implemented in a double poly, single metal, twin well CMOS process. As shown in FIG. 2A, active area 20 (e.g., N+) is diffused into a well region (e.g., P-well). A control gate polysilicon layer 25 is laid out perpendicular to active region 20 and defines drain and source regions 21 and 22, respectively. The overlap area between control gate polysilicon 25 and active area 20 forms the transistor channel region 26. A non-self aligned tunnel window 23 is formed on the drain side (21) of each memory cell as depicted. A floating polysilicon layer 24 overlaps active area 20.

As shown in FIG. 2A, tunnel area 23 partially extends over drain region 23 such that it has a first region 23A under gate poly 25 (i.e., over the channel) and a second region 23B over drain 21. The overlap region 23B of tunnel window 23 will be removed during subsequent steps in the process.

Figure 2C:
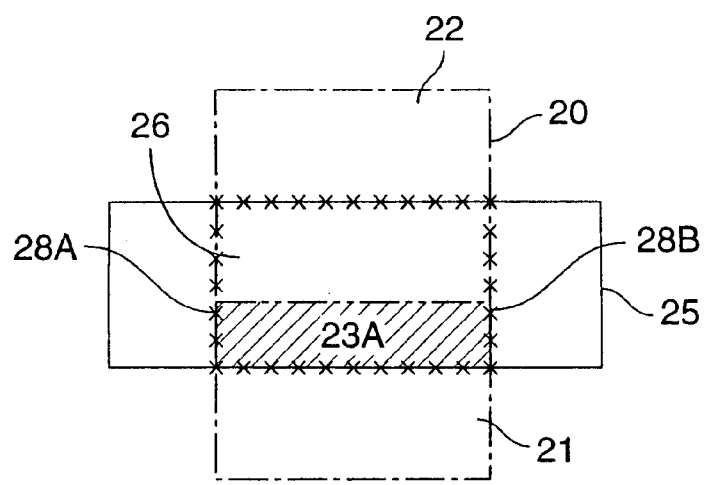

FIG. 2B shows a top view of the flash cell as formed at the completion of the process. As depicted in FIG. 2B, both tunnel window 23 and floating gate poly 24 are etched back to within the area of channel region 26. Note that the area defining tunnel window 23 does not coincide with the area defining channel region 26. This appreciably increases the gate capacitive coupling ratio of the cell allowing faster operation. Furthermore, in the preferred embodiment shown, tunnel oxide window 23 as thus formed is separated from the field oxide (not shown) and has no edges abutting field oxide, eliminating potential leakage caused by defects at the field edge. Tunnel oxide window 23 may alternatively extend all the way to the field edges of the channel as shown in FIG. 2C. The memory cell embodiment shown in FIG. 2C still exhibits the higher gate capacitive ratio because tunnel window 23 does not coincide with the entire area defining channel region 26.

Figure 3:
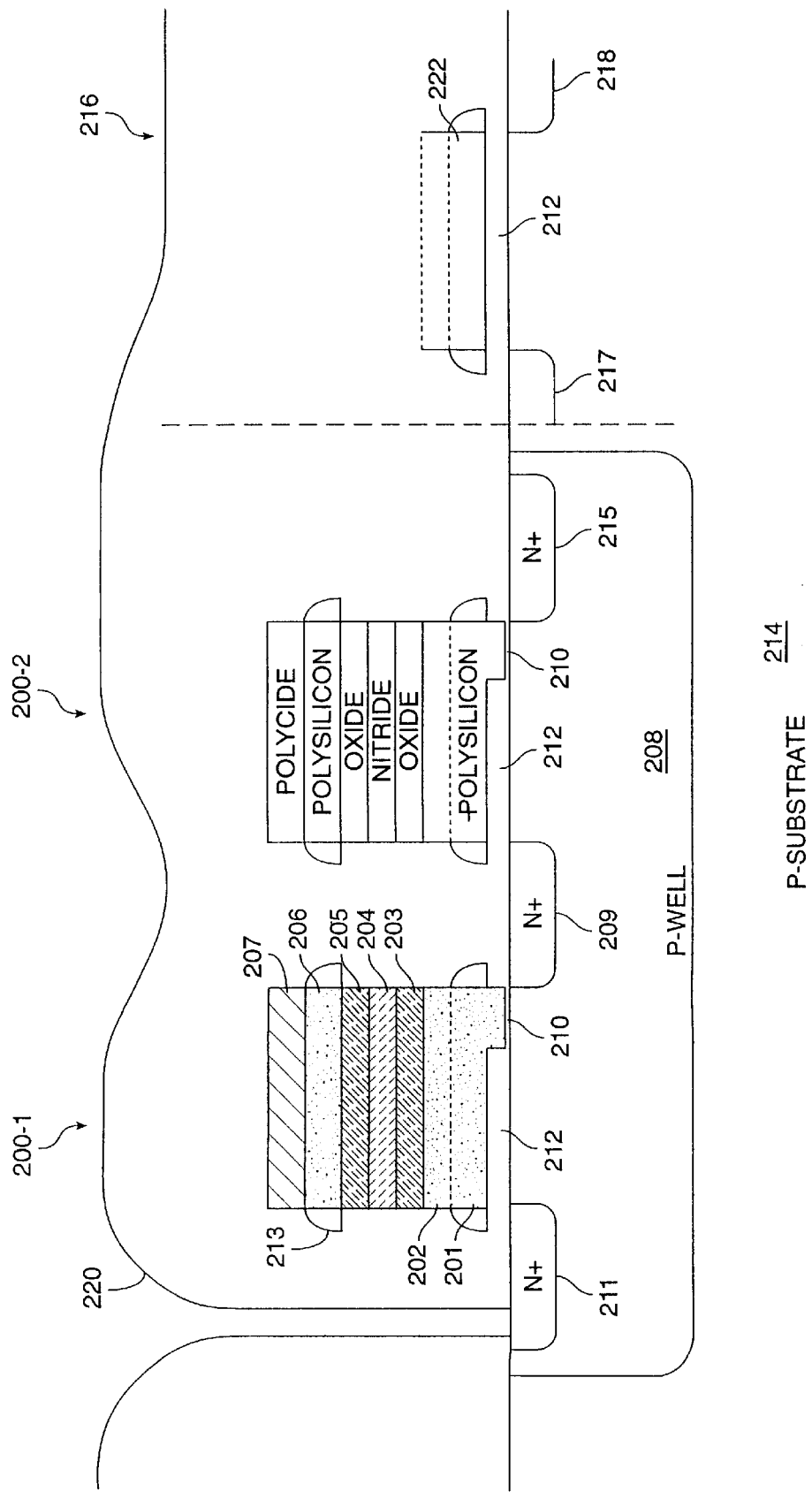
FIG. 3 illustrates the cross section of two flash memory cells perpendicular to word line and a high voltage transistor switch according to the present invention.

Referring to FIG. 3, there is shown a cross section of two flash memory cells 200-1 and 200-2 in a direction perpendicular to the word line, and a high voltage transistor switch 216 according to one embodiment of the present invention. In this exemplary implementation, N+ source drain regions are diffused into a p-well region 108, and the drain region for one cell acts as the source for the adjacent cell. That is, N+ region 211 forms the source terminal of cell 200-1, N+ region 209 forms the drain terminal of cell 200-1 as well as the source terminal of cell 200-2, and N+ region 215 forms the drain terminal of cell 200-2. Tunnel window 210 is formed on the drain side of each cell and is preferably of minimum feature size. As mentioned above, in a preferred embodiment, tunnel window 210 is fieldless (i.e., does not abut field oxide) which helps increase endurance. The active area surrounding the tunnel window is covered by relatively thicker cell gate oxide 212 of, for example, about 100–300 Angs. Tunnel window 210 comprises a thin, for example, 70–100 Angs thermal dielectric. Thus, the cell channel region (26 in FIG. 2B) is covered by both tunnel oxide window 210 (23A in FIG. 2B) and relatively thicker gate oxide 212. The tunnel window/active area edge has a gradual step of, for example, 30–200 Angstroms thick.

A first preferably multiple stack polysilicon layer (poly-1 201 and 202 as shown in FIG. 3), forming the memory cell floating polysilicon (i.e., charge storage layer), is formed on top of gate oxide (210 and 212). The total thickness of the multiple stack floating polysilicon 201/202 is preferably about, for example, 500 Angstroms, with typical grain size at the tunnel oxide boundary of approximately less than 100 Angstroms. The control gate terminal (connected to the word line) is formed by a second polysilicon (poly-2) layer 206 preferably combined with a polycide layer 207, that form a combined thickness of approximately 1000–2000 Angstroms. Poly-1 layer 201/202 and silicided poly-2 layer 206/207 are separated by, for example, 150–200 Angstroms thick Oxide-Nitride-Oxide (ONO) 203/204/205 dielectric stack. The memory as thus constructed includes a structure having a substrate>well>tunnel oxide>poly-1>ONO>poly2-polycide stack. Exemplary value for the size of the stack may be approximately 0.28–0.34 $\mu$m.

Cell Process Flow

The cell formation according to one embodiment of the present invention begins with a p-type silicon substrate 214. After the typical CMOS steps forming N- and P-well regions, active areas (36 in FIG. 2B) are defined by masking and etching steps. This is preferably followed by a field implant to increase the parasitic field threshold voltage. A thick field oxide of, for example, 3000–5000 Angstroms is then grown all over the wafer to isolate different active areas followed by nitride strip and kooi oxide growth. A p-well protect mask is then used to block p-well formation from areas where high voltage circuit blocks will be built. This is to avoid high back-biased threshold voltages of highly doped p-well.

After resist strip and an oxide clean step, gate oxide 212 is formed by growing a high quality thermal oxide (e.g., 150–190 Angstroms thick) all over the wafer. This is followed by a cell threshold voltage (Vt) adjust mask and an implant (using e.g., Boron) to adjust the cell threshold to appropriate value between the programmed and the erased Vt distribution target. After implant the resist is stripped.

The wafers are then masked to form tunnel windows 210 for the memory cells. This mask is a critical mask as this term is used in the art. The wafers are then subjected to a short (e.g., 10–25 sec.) wet oxide cleaning step to clean the tunnel windows with non roughening characteristics. The resist is removed from the wafers and the surface is cleaned again to remove organic, metallic and hydrocarbons from the surface.

The next step involves forming the tunnel oxide by growing a high quality thermal oxide, of for example 70–85 Angstroms to cover the whole wafer. This is followed by deposition of the first of several layers of polysilicon layers to form the floating polysilicon having layers that are each engineered with varying grain sizes. The top layer of poly (layer 202) is preferably implanted with N+ dopants to amorphize the poly and dope it to achieve for example 200–500 ohms/square sheet resistivity.

The wafers are then oxidized (at e.g., 900–105 C) to grow thermal oxide of for example 100 Angstroms. This step forms oxide layer 203 and is followed by deposition of about 75–90 Angstroms of silicon-nitride (layer 204) grown at exemplary temperatures of 650–700 C. The wafers are then subjected to a wet oxidation to cover the nitride surface with 30–50 Angstroms of blocking oxide (1000 C wet oxidation to grow 3500–4000 Angs on bare silicon). This series of steps forms ONO layers 203/204/205.

Next, the wafers are masked again to etch ONO/poly-1/gate-tunnel islands in the memory array. This etch is preferably performed anisotropically and is designed to endpoint on the tunnel oxide. The polysilicon/ONO/gate oxide stack on high voltage transistors 216 are also masked in this step to protect the high voltage (HV) transistor gates 222. After resist strip the wafers are subjected to a light oxidation at 800–900 C in a dry ambient. This oxidation is done to seal off the exposed edges of floating, gate 201/202 that is freshly exposed after the etch.

The memory array core is then masked to clean the periphery with a wet/dry etch. The memory array core mask is also used to protect the high voltage circuit areas. After the etch, the resist is stripped and the wafers are masked again to form self-aligned high voltage graded junctions for the HV enhancement transistors. The high voltage implant could be for example a Phosphorus 31 implant 5E13-5E14 #/cm2 or a double-diffused Phosphorus/arsenic combination implant.

After the implant, the resist is stripped and the wafers are subjected to a low voltage threshold adjust mask or blanket, and implant sequence followed by a high quality wet gate oxidation to grow about 70–110 Angstroms of oxide in the periphery active areas. The wafers are then covered with approximately 1.5 kA to 2.0 kA polysilicon layer that forms the gate of the periphery transistors and the first poly layer (206) of the word line for memory cell array. To reduce heat generation and resistivity of the word line poly, a 1000–2000 Angstrom layer of $WSi_x$ is deposited over the entire wafer that forms the top layer 207 for the control gate of the memory cell. Next, the wafers are subjected to reoxidation at about 900–950 C for approximately 30–50 minutes.

The memory cell stack is then defined by a masking step that also protects the periphery. The stacked array mask etch is used to etch the polycide/ONO/poly-1/tunnel sandwich 200. After the etch, wafers are cleaned to remove organics, hydrocarbons and post etch residues. The high voltage transistors are covered with resist during this etch.

The wafers are masked again to define the gate polycide of the periphery low voltage transistors. After the gate poly etch the resist is stripped. The high voltage transistors are exposed during this etch. Both the polycide and the poly are etched away. About 100 Angstroms of ONO is etched away also leaving a 50–100 Angstroms of dielectric on the HV gates.

The n-tip mask is then used to form the lightly doped drain (LDD) tips of the NMOS transistor followed by p-tip mask and implant. The n-tip mask is blocked from memory array and HV transistors. The spacer deposition is followed by spacer etch and N+ and P+ source drain formation. The first interlayer dielectric is then formed by either BPSG, BPTEOS with 4/4 B/P, or the like. The inter layer dielectric (ILD) is then reflowed at about 850–920 C and SOG planarized and the contacts are masked and opened.

This is followed by barrier metal deposition followed by tungsten plug formation and first metal (metal-1) deposition. The metal-1 mask is then used to define the interconnect and memory array bit lines. Finally, metal-1 layer is covered with thick ILD and passivation oxynitride is deposited and etched using the pad mask.

Cell Electrical Design

Figure 4:
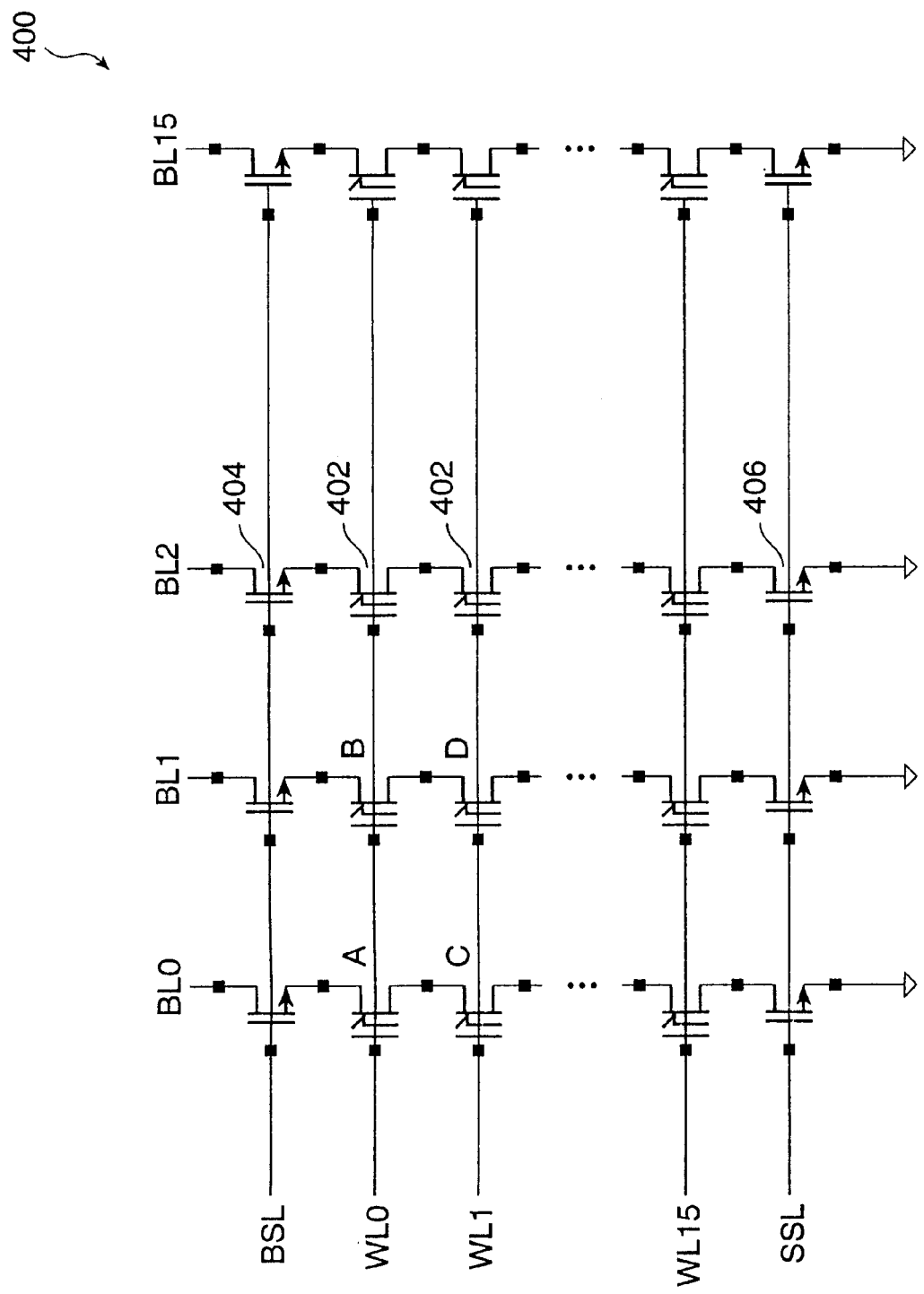
FIG. 4 is a circuit schematic for an exemplary memory array made of flash cells according to the present invention.

In a preferred embodiment of the present invention cells are programmed (e.g., high cell Vt) and erased (e.g., low cell Vt) by Fowler Nordhiem tunneling to and from the same tunnel window on the drain side. The various modes of operation, including programming, erase and read will be described in connection with the exemplary memory array circuit shown in FIG. 4. Referring to FIG. 4 there is shown an exemplary circuit schematic for an array 400 made of flash memory cells according to the present invention. Array 400 includes memory cells 402 located at intersection of 16 word lines (WL0–WL15) and 16 bit lines (BL0–BL15). Bit line select transistors 404 respectively couple bit lines BL0–BL15 to memory cells 402. Source select transistors 406 couple ground (or Vss) to memory cells 402. A bit line select control line BSL controls gate terminals of bit select transistors 404, and a source select control line SSL controls gate terminals of source select transistors 406.

Table I below sets forth a preferred biasing scheme for various cell operations for an individual cell according to the present invention.

TABLE I

| Control Line | Erase | Program | Read | Condition |
|---|---|---|---|---|
| BSL | Vcc | Vcc | Vcc | Selected |
| SSL | Vss | Vss | Vcc | Selected |
| BL0 | Vcc | Vss | 1.0–1.4V | Selected |
| BL1 | Vss | Vcc | 0.5V | Unselected |
| WL0 | Vcc | Vcc | Vcc | Unselected |
| WL1 | −12 to −15V | 15–20V | Vss | Selected |

Erase Operation:

In the exemplary biasing convention described herein, cells are erased by the action of applying negative gate voltage of, for example, −12 to −15 volts on the selected word lines or a single word line (WL1), and applying a voltage approximately equal to Vcc (e.g., Vcc–2Vtn to Vcc) on the selected bit lines or a single bit line (e.g., BL0). A voltage of about Vcc is applied to bit line select control line BSL, while source select control line SSL is coupled to ground or Vss. This condition generates the necessary electrical field to force electrons to leave the floating gate through the cell tunnel oxide drain interface. This results in a reduced threshold voltage for the cell.

The bit line voltage level is selected to ensure suppression of band bending and hot hole injection from the cell drain into the tunnel oxide. However, due to the reduced tunnel area of the cell of the present invention and the resulting increase in cell coupling ratio, the voltage applied to the bit line can be as low as Vcc.

The erase coupling is adequate to achieve read/erase threshold voltage Vtrde of, for example, about −2.5 V. A Vtrde of −2.5 volts helps achieve adequate read current with a lower word line voltage. Further, even with a Vtrde of −2.5 V, the cell of the present invention does not suffer from over-erasure. Conventional memory cells, such as single transistor ETOX cells, however, do suffer from over-erasure when negative threshold voltages are used (i.e., cells are driven into deep depletion). Such over-erasure leads to significant performance drawbacks such as program inhibit and/or wide erase threshold variations. The flash cell according to the present invention is less sensitive to both these problems.

The engineering of the erase interface (floating poly/tunnel oxide) in the flash cell of the present invention is controlled by limiting the fluctuation of the local barrier height seen by electrons. This allows a tight threshold convergence without relying on algorithm circuits. Secondly, the nature of the memory cell of the present invention limits the threshold variation. The threshold voltage of the thick gate oxide portion of the cell helps to improve the punch-through margin of the cell.

Typical erase current depends on the block size and is of the order of a few mA. The erase speed is primarily a function of the field across tunnel oxide which can be, for example, approximately 8.5 to 10 MV/cm to achieve block erasure in less than for example 1 msec.

Programming operation:

The programming operation is done by applying a high voltage (e.g., 15 to 20 V) on the selected word line (WL1) and grounding the selected bit line (BL0), while the unselected bit lines (BL1–BL15) are at Vcc. Referring to FIG. 4, to program memory cell 402-C, a high voltage of for example 15 to 20 volts is applied to WL1. Vcc is applied to BSL control line and WL0 to couple BL0 to the drain terminal of memory cell 402-C. With BL0 grounded, the drain terminal of cell 402-C receives ground potential. Control line SSL remains at VSS and unselected word lines WL2–WL15 receive VCC. Thus, the cells are programmed serially in a NAND type structure by passing Vss to the selected cells as the pass (unselected) word lines are pulled up to pass Vss.

The typical programming current for the memory cell of the present invention may be, for example, as low as about 100 pA/cell. The typical programming current required by convention ETOX cells, on the other hand, is around 1 mA. The lower programming current requirement of the present invention allows for the pump circuits to be aggressively down sized, for a more compact overall design.

Another advantageous feature of the present invention is that it provides for the ability to erase and/or program on a byte by byte basis. Because neither erase nor programming operations require shifting the potential supplied to the entire bulk (substrate) for the array of cells, erase or programming of memory array 400 need not be limited to the entire block.

Read Operation:

The read operation is accomplished by grounding the selected word line WL1=Vss and applying a low voltage of, for example, 1.0–1.5 volts to the selected bit line BL0. Unselected bit lines (BL1–BL15) receive a voltage in the range of Vss to 0.5 volts. Unselected word lines WL0 and WL2–WL15 receive Vcc which allows their memory cells 402 to pass Vss to the selected cell, e.g., 402-C, and couple the drain terminal of selected memory cell 402-C to selected bit line BL0. If memory cell 402-C is programmed (i.e, high Vt), then the voltage on selected bit line BL0 remains unaffected. If memory cell 402-C is not programmed (i.e., low Vt), selected bit line BL0 is pulled down to Vss.

Finally, when changing from one mode (e.g., erase) to another (e.g., program, the memory array first enters the program inhibit mode of operation. The program inhibit mode avoids accidental programming of the cell during the transition from one mode of operation to another. In program inhibit mode, according to the present invention, the entire array enters an unselected condition by applying Vss to BSLs, SSLs and BLs, and Vcc to WLs.

In conclusion, the present invention offers a single transistor, double-poly flash cell and a method of manufacture for the same that improves data retention, increases capacitive coupling and speed of operation, and improves reliability among other advantages. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. An array of flash memory cells comprising:

a plurality of columns of serially connected flash memory cells, each memory cell having a gate terminal;

a plurality of bit lines respectively coupled to drain side of said plurality of columns of memory cells via a respective plurality of bit line select transistors, said plurality of bit line select transistors having gate terminals coupled to a bit line select control line;

a plurality of word lines, each one coupling to a gate terminal of one memory cell in each of said plurality of columns to from rows of memory cells with common gate terminals; and a plurality of source select transistors respectively coupling a source side of said plurality of columns of memory cells to a logic low voltage, and having gate terminals coupled to a source select control line, wherein, during programming:

a logic high voltage is applied to said bit line select control line to turn on bit line select transistors, a logic low voltage is applied to source select control line to turn off source select transistors;

a logic low voltage is applied to a selected bit line while a logic high voltage is applied to unselected bit lines, and a logic high voltage is applied to unselected word lines, while a boosted positive voltage is applied to a selected word line.

2. An array of flash memory cells comprising:

a plurality of columns of serially connected flash memory cells, each memory cell having a gate terminal;

a plurality of bit lines respectively coupled to drain side of said plurality of columns of memory cells via a respective plurality of bit line select transistors, said plurality of bit line select transistors having gate terminals coupled to a bit line select control line;

a plurality of word lines, each one coupling to a gate terminal of one memory cell in each of said plurality of columns to from rows of memory cells with common gate terminals; and a plurality of source select transistors respectively coupling a source side of said plurality of columns of memory cells to a logic low voltage, and having gate terminals coupled to a source select control line, wherein, during erase:

a logic high voltage is applied to said bit line select control line to turn on bit line select transistors, a logic low voltage is applied to source select control line to turn off source select transistors;

a logic high voltage is applied to a selected bit line while a logic low voltage is applied to unselected bit lines, and a logic high voltage is applied to unselected word lines, while a boosted negative voltage is applied to a selected word line.

3. An array of flash memory cells comprising:

a plurality of columns of serially connected flash memory cells, each memory cell having a gate terminal;

a plurality of bit lines respectively coupled to drain side of said plurality of columns of memory cells via a respective plurality of bit line select transistors, said plurality of bit line select transistors having gate terminals coupled to a bit line select control line;

a plurality of word lines, each one coupling to a gate terminal of one memory cell in each of said plurality of columns to from rows of memory cells with common gate terminals; and a plurality of source select transistors respectively coupling a source side of said plurality of columns of memory cells to a logic low voltage, and having gate terminals coupled to a source select control line, wherein, during program inhibit a logic low voltage is applied to said bit line select control line, source select control line, and bit lines, while a logic high voltage is applied to word lines.

4. A method of operating a flash memory device wherein programming memory cells is accomplished by the steps of:

applying a logic high voltage to a bit line select control line to turn on bit line select transistors, applying a logic low voltage to a source select control line to turn off source select transistors;

applying a logic low voltage to a selected bit line while a logic high voltage is applied to unselected bit lines, and applying a logic high voltage to unselected word lines, while a boosted positive voltage is applied to a selected word line.

5. The method of operating a flash memory device as in claim 4 wherein erasing memory cells is accomplished by the steps of:

applying a logic high voltage to a bit line select control line to turn on bit line select transistors, applying a logic low voltage to a source select control line to turn off source select transistors;

applying a logic high voltage to a selected bit line while a logic low voltage is applied to unselected bit lines, and applying a logic high voltage to unselected word lines, while a boosted negative voltage is applied to a selected word line.

6. The method of operating a flash memory device as in claim 5 wherein program inhibit is accomplished by a step of applying a logic low voltage to a bit line select control line, source select control line, and bit lines, while a logic high voltage is applied to word lines.

* * * * *